United States Patent
Lim et al.

(10) Patent No.: US 7,667,331 B2
(45) Date of Patent: Feb. 23, 2010

(54) INTERPOSER CHIP, METHOD OF MANUFACTURING THE INTERPOSER CHIP, AND MULTI-CHIP PACKAGE HAVING THE INTERPOSER CHIP

(75) Inventors: Jong-Seok Lim, Suwon-si (KR); Hyo-Dong Ban, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 27 days.

(21) Appl. No.: 12/217,643

(22) Filed: Jul. 8, 2008

(65) Prior Publication Data

US 2009/0014895 A1    Jan. 15, 2009

(30) Foreign Application Priority Data

Jul. 9, 2007    (KR) .................... 10-2007-0068474

(51) Int. Cl.
*H01L 23/48* (2006.01)
*H01L 23/52* (2006.01)
*H01L 29/40* (2006.01)

(52) U.S. Cl. ...................... 257/773; 257/786

(58) Field of Classification Search ................. 257/786, 257/700, 773, 686, 777

See application file for complete search history.

(56) References Cited

U.S. PATENT DOCUMENTS

| 6,342,715 | B1 * | 1/2002 | Shimizu et al. | 257/314 |
| 2001/0040242 | A1 * | 11/2001 | Koike | 257/170 |
| 2007/0075437 | A1 | 4/2007 | Nishimura et al. | |
| 2007/0120246 | A1 | 5/2007 | Lim | |
| 2007/0170544 | A1 * | 7/2007 | Koike | 257/529 |
| 2008/0042300 | A1 * | 2/2008 | Nishimura et al. | 257/778 |

FOREIGN PATENT DOCUMENTS

| JP | 2004-047715 | 2/2004 |
| JP | 2007-103411 | 4/2007 |
| KR | 10-0648040 | 11/2006 |

\* cited by examiner

*Primary Examiner*—S. V Clark
(74) *Attorney, Agent, or Firm*—Mills & Onello, LLP

(57) ABSTRACT

An interposer chip in accordance includes an insulating layer, conductive patterns and a dummy pattern. The conductive patterns are formed on the insulating layer. The dummy pattern is formed on the insulating layer to suppress a bending of the insulating layer. Further, the dummy pattern can have first isolating grooves formed along peripherals of the conductive patterns to isolate the dummy pattern from the conductive patterns. Thus, the interposer chip is not vulnerable to being bent. Further, an electrical short between the conductive patterns through the dummy pattern caused by particles is substantially avoided.

20 Claims, 9 Drawing Sheets

INTERPOSER CHIP, METHOD OF MANUFACTURING THE INTERPOSER CHIP, AND MULTI-CHIP PACKAGE HAVING THE INTERPOSER CHIP

PRIORITY STATEMENT

This application claims priority under 35 U.S.C. § 119 to Korean Patent Application No. 10-2007-0068474 filed on Jul. 9, 2007 in the Korean Intellectual Property Office (KIPO), the contents of which are herein incorporated by reference in their entirety.

BACKGROUND OF THE INVENTION

1. Field of the Invention

The present invention relates to an interposer chip, a method of manufacturing the interposer chip, and a multi-chip package having the interposer chip. More particularly, the present invention relates to an interposer chip for electrically connecting together two semiconductor chips having different sizes, a method of manufacturing the interposer chip, and a multi-chip package having the interposer chip.

2. Description of the Related Art

Generally, various semiconductor fabricating processes can be performed on a wafer to form a plurality of semiconductor chips. In order to mount the semiconductor chips on a printed circuit board (PCB), a packaging process can be carried out on the wafer to form semiconductor packages.

In order to increase storage capacity of the packaged semiconductor device, a multi-chip package including sequentially stacked semiconductor chips can have been widely researched. The stacked semiconductor chips can be electrically connected with each other via conductive wires.

Here, when the semiconductor chips have different sizes, it can be difficult to directly connect the stacked semiconductor chips only using the conductive wires due to length limits of the conductive wires. In this case, an interposer chip can be interposed between the semiconductor chips. The semiconductor chips can be electrically connected with each other through the interposer chip.

A conventional interposer chip can include an insulating layer and a conductive layer pattern formed on the insulating layer. The semiconductor chips having different sizes can be electrically connected with each other via the conductive pattern.

However, the conventional interposer chip can be prone to becoming bent due to a weak strength of the insulating layer. When the interposer chip becomes bent, the conductive layer pattern can also be bent. As a result, connection of the conductive wires connected to the bent conductive layer pattern can become compromised. Consequently, an electrical connection between the conductive layer pattern and the conductive wire can have very low reliability.

SUMMARY OF THE INVENTION

In accordance with the present invention an interposer chip can be provided that has improved strength to resist a bending force applied to the interposer chip.

Also in accordance with the present invention a method of manufacturing the above-mentioned interposer chip can be provided.

Also in accordance with the present invention a multi-chip packaging having the above-mentioned interposer chip can be provided.

An interposer chip in accordance with one aspect of the present invention includes an insulating layer, conductive patterns and a dummy pattern. The conductive patterns are formed on the insulating layer. The dummy pattern is formed on the insulating layer to suppress a bending of the insulating layer. Further, the dummy pattern is electrically isolated from the conductive patterns by first isolating grooves formed along a periphery of the conductive patterns.

The interposer chip can also have a plurality of second isolating grooves extending from the first isolating grooves to divide a portion of the dummy pattern into a plurality of regions electrically isolated from each other.

The plurality of regions can include at least one first region formed in a lengthwise direction of the conductive patterns and each of the second isolating grooves can extend from portions of each of the first isolating grooves adjacent to both corners of both ends of each of the conductive patterns to form second regions that are electrically isolated from the at least one first region.

The second isolating grooves can extend in a direction substantially in parallel with a lengthwise direction of the conductive patterns.

The interposer chip can include a plurality of third isolating grooves configured to divide a portion of the dummy pattern between adjacent ones of the conductive patterns into a plurality of regions electrically isolated from each other.

Each of the third isolating grooves can include at least one first sub-groove extending in a direction substantially perpendicular to the lengthwise direction of the conductive pattern, and at least one second sub-groove extending in a direction substantially in parallel with the lengthwise direction of the conductive pattern.

Between adjacent conductive patterns, there can be two first sub-grooves, and one of the at least one second sub-groove connected between the two first sub-grooves and configured to form an "I" shape of the third isolating groove.

Between adjacent conductive patterns, there can be a plurality of first sub-grooves and a plurality of second sub-grooves configured to form a lattice-like shape of the third isolating groove.

The conductive patterns and the dummy pattern can include substantially the same conductive material.

Each of the conductive patterns can include two pads and a conductive line connected between the pads. The conductive line can have a width narrower than that of the pads.

According to another aspect of the present invention, provided is a method of manufacturing an interposer chip. The method includes forming a conductive layer on an insulating layer. First isolating grooves are formed at the conductive layer to form conductive patterns and a dummy pattern electrically isolated from the conductive patterns by the first isolating groove.

The method can further include forming a plurality of second isolating grooves dividing a portion of the dummy pattern into a plurality of regions electrically isolated from each other.

The second isolating grooves can be formed simultaneously with the first isolating grooves.

The method can further include forming a plurality of third isolating grooves dividing a portion of the dummy pattern between the adjacent ones of the conductive patterns into a plurality of regions electrically isolated from each other.

The third isolating grooves can be formed simultaneously with the first isolating grooves.

The conductive layer can include aluminum, tungsten, or copper.

In accordance with another aspect of the invention, provided is a multi-chip package that includes a printed circuit board (PCB), a first semiconductor chip, an interposer chip, and a second semiconductor chip. The first semiconductor chip is stacked on the PCB and electrically connected to the PCB. The interposer chip is stacked on the first semiconductor chip. The interposer chip has a size smaller than that of the first semiconductor chip. The interposer chip includes an insulating layer, conductive patterns, and a dummy pattern. The conductive patterns are formed on the insulating layer to be electrically connected to the first semiconductor chip. The dummy pattern is formed on the insulating layer and configured to suppress a bending of the insulating layer. Further, the dummy pattern has first isolating grooves formed along a periphery of the conductive patterns to electrically isolate the dummy pattern from the conductive patterns. The second semiconductor chip is stacked on the interposer chip and electrically connected with the conductive patterns. The second semiconductor chip has a size smaller than that of the interposer chip.

The multi-chip package can further include conductive wires for electrically connecting the PCB and the first semiconductor chip, the first semiconductor chip and the interposer chip and the interposer chip and the second semiconductor chip.

The interposer chip can further include a plurality of second isolating grooves extending from the first isolating grooves to divide a portion of the dummy pattern into a plurality of regions electrically isolated from each other.

The interposer chip can further include a plurality of third isolating grooves dividing a portion of the dummy pattern between adjacent conductive patterns into a plurality of regions.

The interposer chip can have reinforced strength due to the dummy pattern, so the interposer chip will not be bent. Further, the interposer chip can have isolating grooves formed so that an electrical short between the conductive patterns through the dummy pattern caused by particles can be suppressed.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF THE PREFERRED EMBODIMENTS

Figure 1:
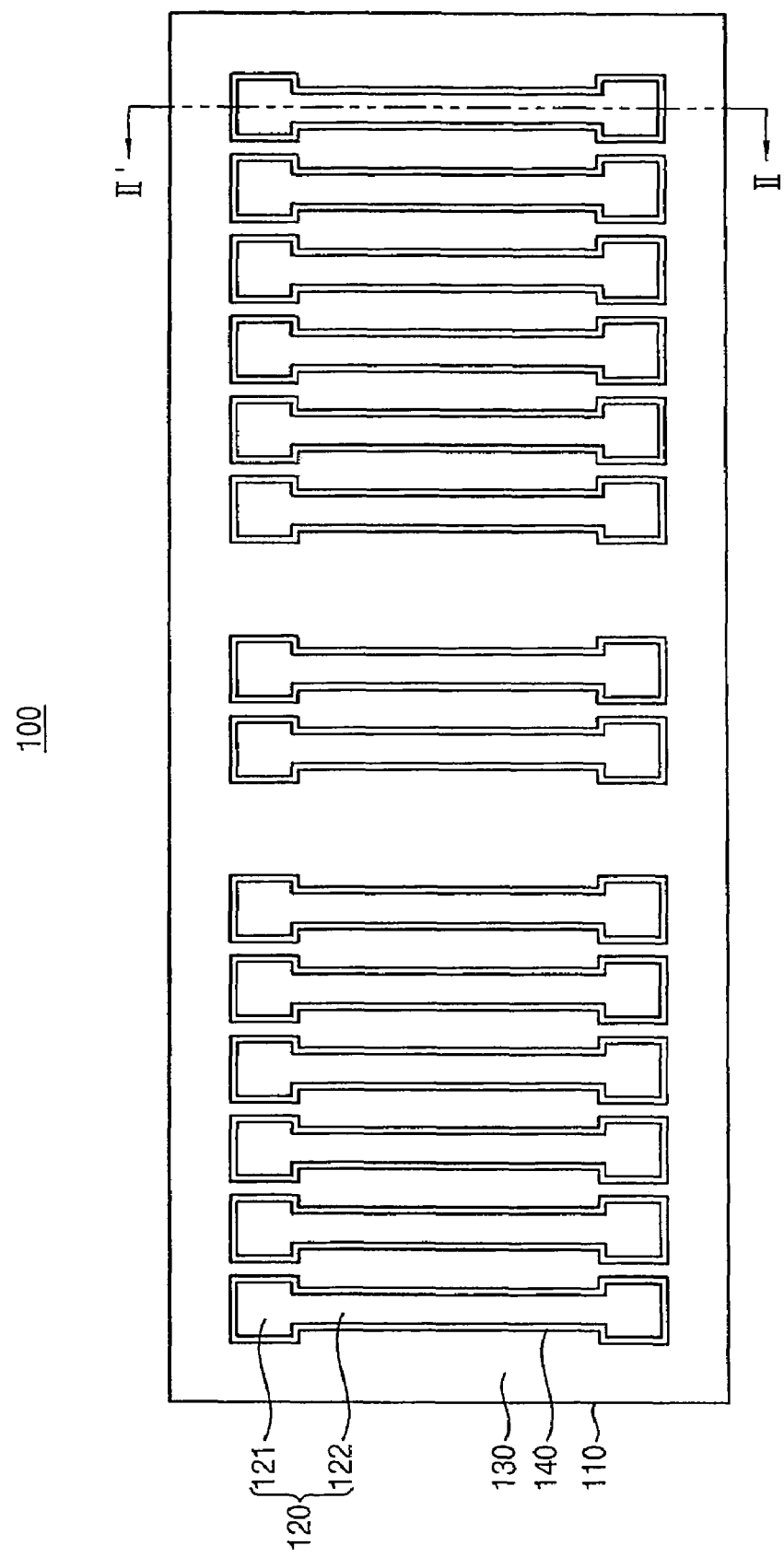
FIG. 1 is a plan view illustrating a first example embodiment of an interposer chip in accordance with aspects of the present invention.

Various embodiments in accordance with the present invention are described more fully hereinafter with reference to the accompanying drawings. The present invention can, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers can be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments in accordance with aspects of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, neither these example embodiments, nor the present invention, should be construed as limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation can result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Interposer Chip

Example Embodiment 1

Figure 2:
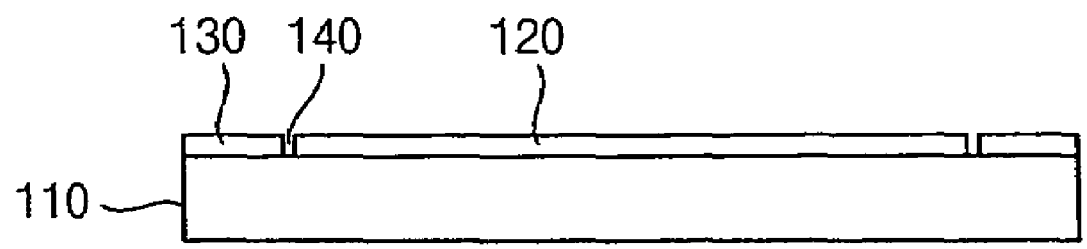
FIG. 2 is a cross-sectional view of the interposer chip of FIG. 1 taken along a line II-II'.

FIG. 1 is a plan view illustrating a first example embodiment of an interposer chip in accordance with aspects of the present invention, and FIG. 2 is a cross-sectional view of the interposer chip of FIG. 1 taken along a line II-II'.

Referring to FIGS. 1 and 2, an interposer chip 100 of this example embodiment includes an insulating layer 110, conductive patterns 120, and a dummy pattern 130.

The insulating layer 110 can have a flat rectangular shape. In this example embodiment, the insulating layer 110 can include an oxide. The insulating layer 110 can be interposed between semiconductor chips having different sizes.

The conductive patterns 120 are formed on the insulating layer 110. In this example embodiment, each of the conductive patterns 120 can include two pads 121 and a conductive line 122 connected between the pads 121. The conductive line 122 can have a width narrower than that of the pad 121. Thus, each of the conductive patterns 120 can have a dumb-bell shape. Further, the conductive patterns 120 can be arranged substantially in parallel with each other. Examples of materials used to form the conductive patterns 120 can include tungsten, aluminum, copper, etc.

The dummy pattern 130 is formed on a portion of the insulating layer 110 where the conductive patterns 120 are not placed. The dummy pattern 130 can be electrically isolated from the conductive patterns 120. To isolate the dummy pattern 130 from the conductive patterns 120, first isolating grooves 140 are formed between the dummy pattern 130 and the conductive patterns 120. In this example embodiment, each of the first isolating grooves 140 can be formed along a periphery of each of the conductive patterns 120 to prevent the dummy pattern 130 from being electrically connected or coupled with the conductive patterns 120. Here, since each of the conductive patterns 120 have the dumb-bell shape, each of the first isolating grooves 140 can also have a dumb-bell shape.

The dummy pattern 130 reinforces the strength of the insulating layer 110 to substantially prevent the insulating layer 110 from being bent. In this example embodiment, the dummy pattern 130 can include a material substantially the same as that of the conductive patterns 120. Therefore, examples of materials that can be used to form the dummy pattern 130 can include tungsten, aluminum, copper, etc. In other embodiments, the material of the dummy pattern 130 can be different from that of the conductive patterns 120.

According to this example embodiment, the dummy pattern 130 can be formed on the insulating layer 110. Thus, the insulating layer 110 can have reinforced strength. As a result, the insulating layer 110 interposed between the stacked semiconductor chips may more effectively resist being bent.

Example Embodiment 2

Figure 3:
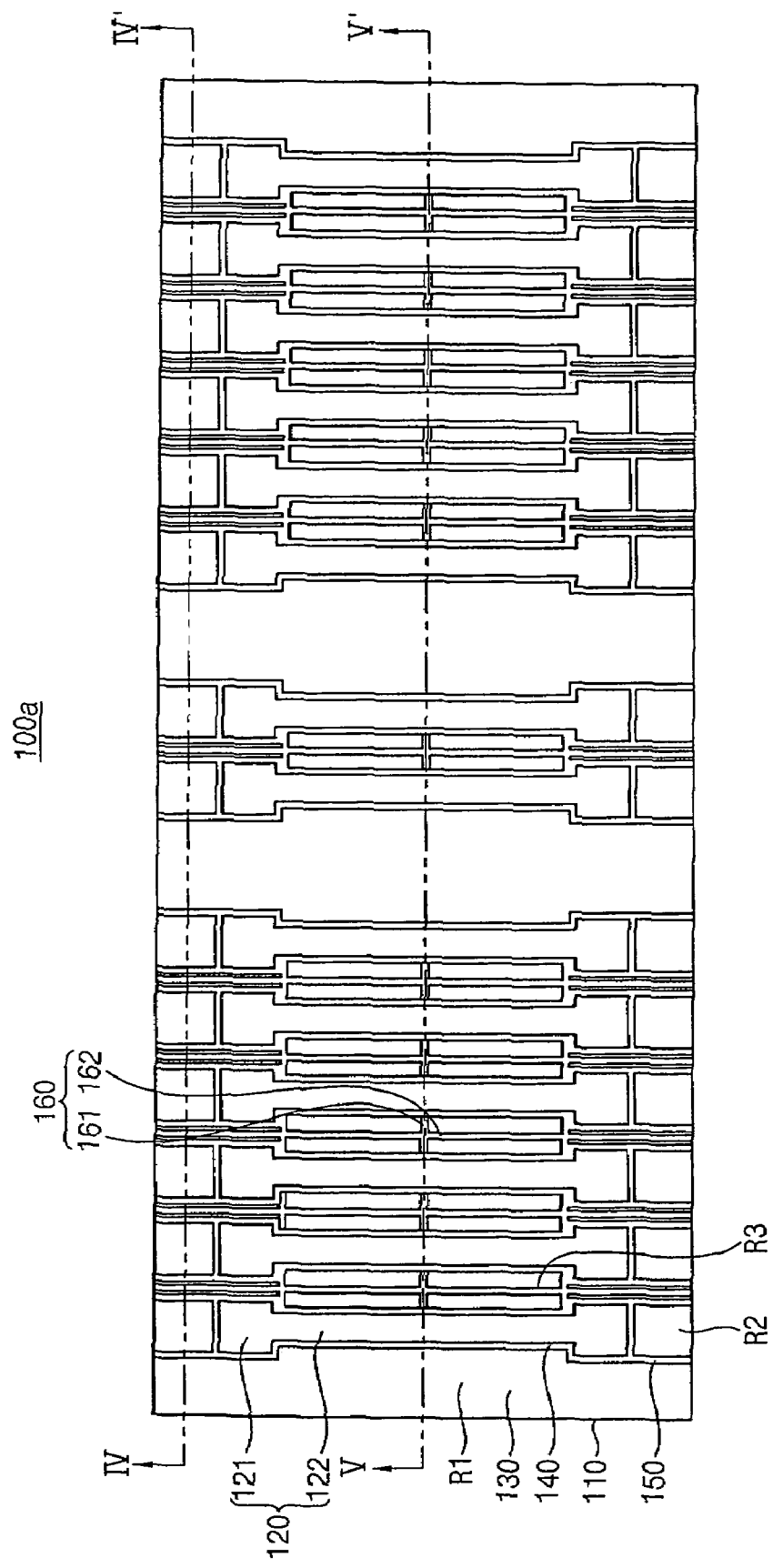
FIG. 3 is a plan view illustrating a second example embodiment of an interposer chip in accordance with aspects of the present invention.
Figure 4:
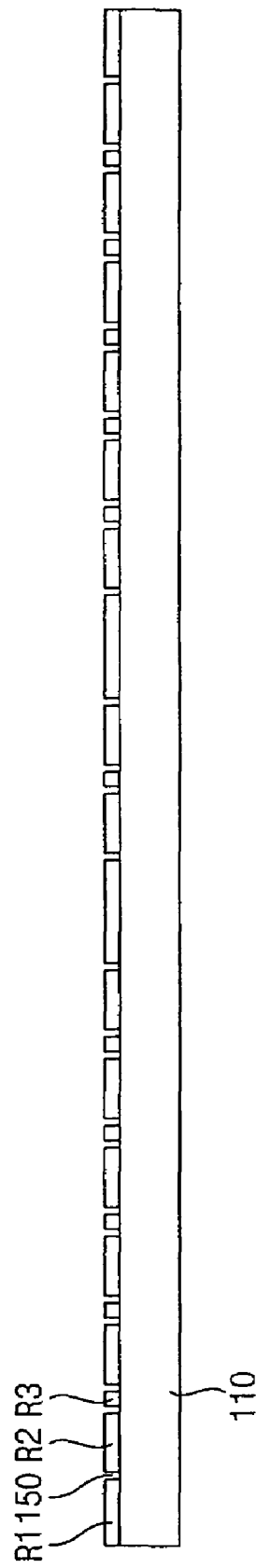
FIG. 4 is a cross-sectional view of the interposer chip of FIG. 3 taken along a line IV-IV'.
Figure 5:
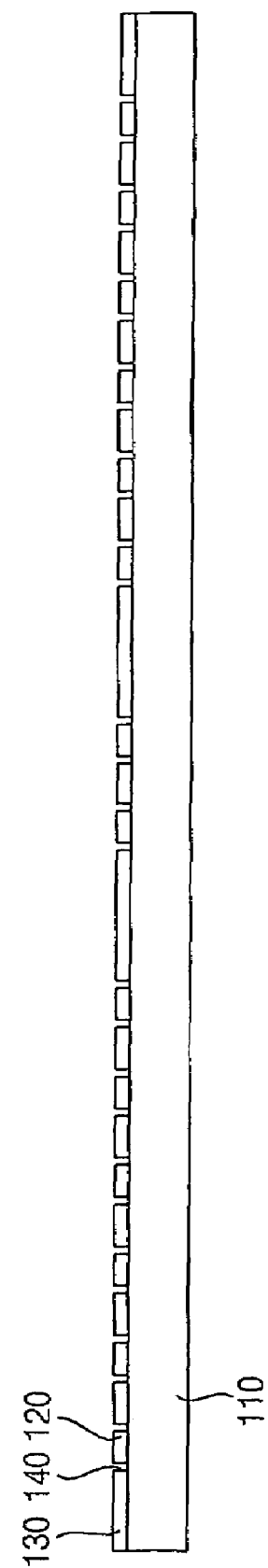
FIG. 5 is a cross-sectional view of the interposer chip of FIG. 3 taken along a line V-V'.

FIG. 3 is a plan view illustrating a second example embodiment of an interposer chip in accordance with aspects of the present invention, FIG. 4 is a cross-sectional view of the interposer chip of FIG. 3 taken along a line IV-IV', and FIG. 5 is a cross-sectional view of the interposer chip of FIG. 3 taken along a line V-V'.

An interposer chip 100a of this example embodiment include elements substantially the same as those of the interposer chip 100 in Example Embodiment 1, except that the interposer chip 100a of this example embodiment further includes second isolating grooves and third isolating grooves. Thus, the same reference numerals refer to the same elements and any further illustrations with respect to the same elements are omitted herein for brevity.

Referring to FIGS. 3 to 5, the interposer chip 100a of this second example embodiment has the second isolating grooves 150 and the third isolating grooves 160. The second isolating grooves 150 are formed at the dummy pattern 130 to divide the dummy pattern 130 into a plurality of regions. Thus, the divided regions are electrically isolated from each other by the second isolating grooves 150. As a result, an electrical short between the conductive patterns 120 caused by conductive particles can be prevented.

In this example embodiment, each of the second isolating grooves 150 can extend from portions of each of the first isolating grooves 140 adjacent to both corners of pads 121 to both sides of the insulating layer 110. Further, the second isolating grooves 150 can extend in a direction substantially in parallel with a lengthwise direction of the conductive patterns 120. Thus, a portion of the dummy pattern 130 enclosing any one of the conductive patterns 120 can be divided into a first region R1, a second region R2, and a third region R3 by the second isolating grooves 150. For example, although an electrical short between any one of the conductive patterns 120 and the first region R1 of the dummy pattern 130 can be generated, the electrically shorted conductive pattern 120 is not electrically coupled to another conductive pattern 120, because the first region R1 and the second region R2 are electrically isolated from each other.

The third isolating grooves 160 are formed at portions of the dummy pattern 130 interposed between the adjacent conductive patterns 120, i.e., the third region R3, to prevent an electrical short between the adjacent conductive patterns 120. In this second example embodiment, each of the third isolating grooves 160 can include a first sub-groove 161 and a second sub-groove 162. The first sub-groove 161 can be formed in a direction substantially perpendicular to the lengthwise direction of the conductive patterns 120. Further, the first sub-groove 161 can be located at a central portion of the conductive pattern 120. The second sub-groove 162 can extend in a direction substantially in parallel with the lengthwise direction of the conductive patterns 120 to both sides of the insulating layer 110. That is, the second sub-groove 162 can be intersected with the first sub-groove 161 so that the each of the third isolating grooves 160 can have a cross shape. As a result, the third region R3 can be divided into four sub-regions that are electrically isolated from each other by the third isolating grooves 160. Accordingly, an electrical short between the adjacent conductive patterns 120 is not generated due to the third isolating grooves 160.

According to this second example embodiment, the second isolating grooves and the third isolating grooves can divide the dummy pattern into electrically isolated regions. Thus, electrical shorting between the conductive patterns caused by the conductive particles does not occur.

Example Embodiment 3

Figure 6:
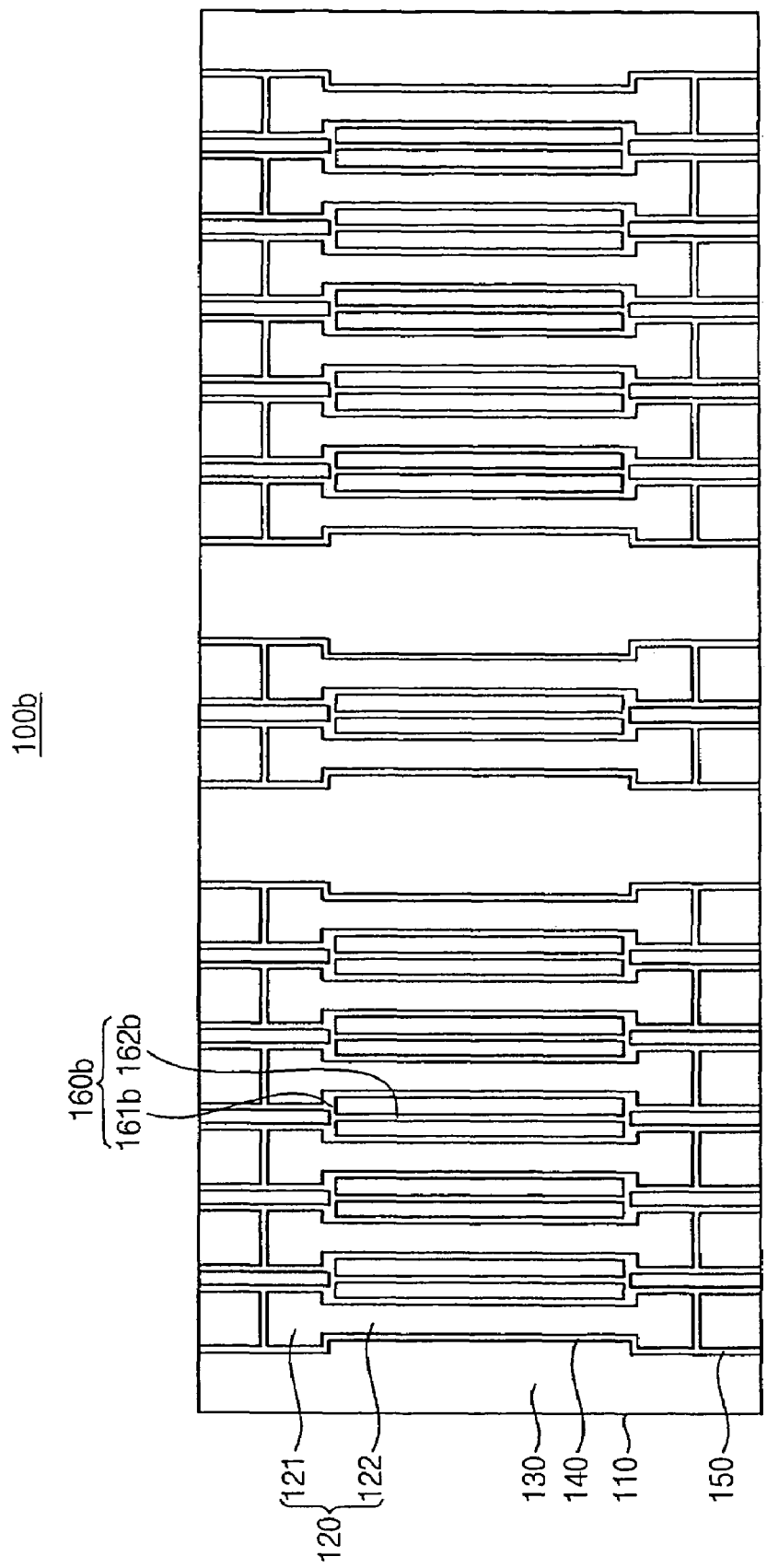
FIG. 6 is a plan view illustrating a third embodiment of an interposer chip in accordance with aspects of the present invention.

FIG. 6 is a plan view illustrating a third embodiment of an interposer chip in accordance with aspects of the present invention.

An interposer chip 100b of this third example embodiment includes elements substantially the same as those of the interposer chip 100a in Example Embodiment 2, except for third isolating grooves. Thus, the same reference numerals refer to the same elements and any further illustrations with respect to the same elements are omitted herein for brevity.

Referring to FIG. 6, the interposer chip 100b of this third example embodiment has the third isolating grooves 160b. Each of the third isolating grooves 160b can include two first sub-grooves 161b and a second sub-groove 162b. The first sub-grooves 161b can be located adjacent to the pads 121. Further, the second sub-groove 162b can be connected between the first sub-grooves 161b. Thus, each of the third isolating grooves 160b can have an "I" shape.

Example Embodiment 4

Figure 7:
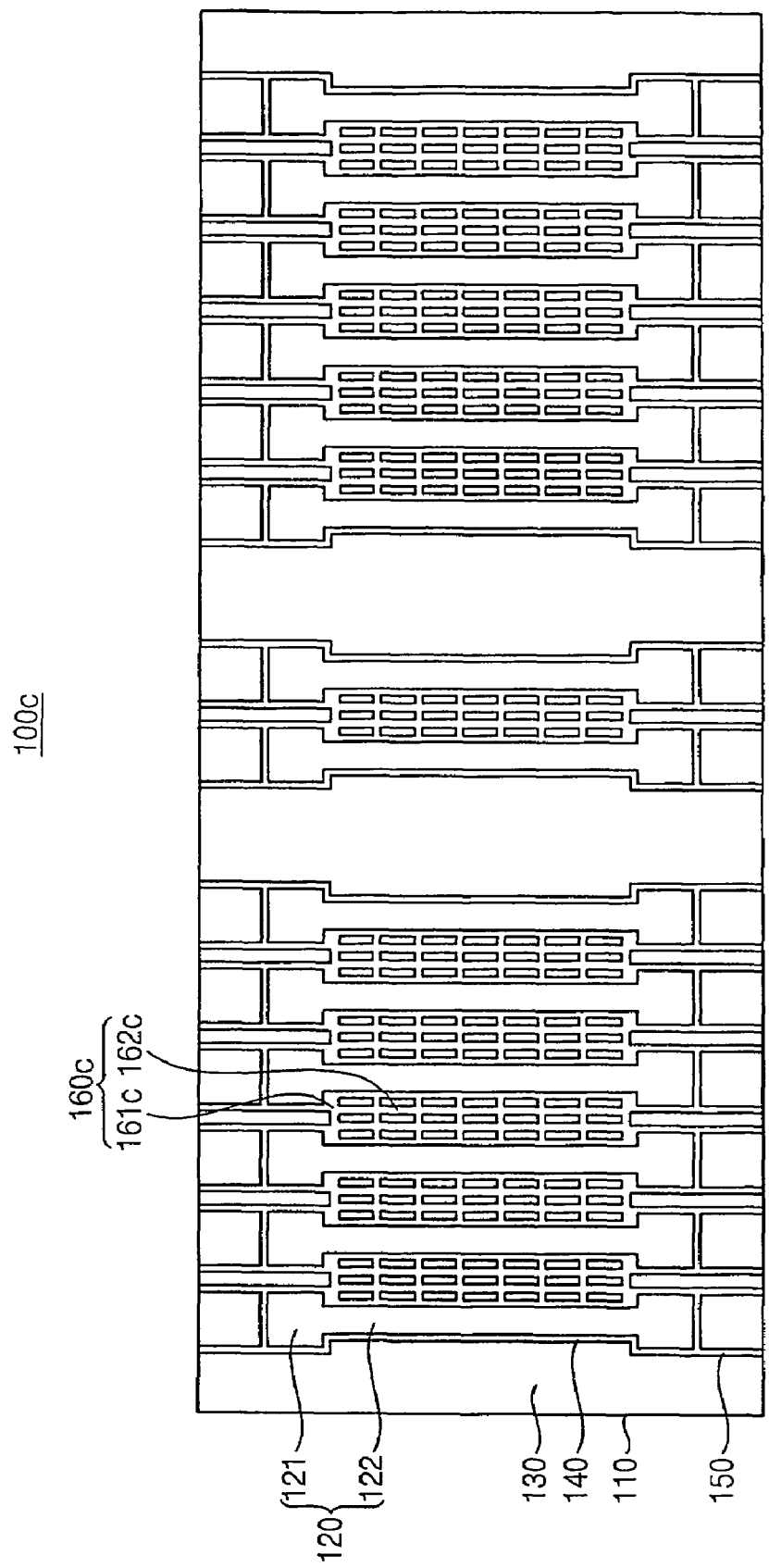
FIG. 7 is a plan view illustrating a fourth embodiment of an interposer chip in accordance with aspects of the present invention.

FIG. 7 is a plan view illustrating a fourth embodiment of an interposer chip in accordance with aspects of the present invention.

An interposer chip 100c of this example embodiment include elements substantially the same as those of the interposer chip 100a in Example Embodiment 2, except for third isolating grooves. Thus, the same reference numerals refer to the same elements and any further illustrations with respect to the same elements are omitted herein for brevity.

Referring to FIG. 7, the interposer chip 100c of this fourth example embodiment includes the third isolating grooves 160c. Each of the third isolating grooves 160c can include a plurality of first sub-grooves 161c and a plurality of second sub-grooves 162c. The first sub-grooves 161c can extend in a direction substantially perpendicular to the lengthwise direction of the conductive patterns 120. Further, the first sub-grooves 161c can be arranged substantially in parallel with each other.

The second sub-grooves 162c can extend in a direction substantially in parallel with the lengthwise direction of the conductive patterns 120. Further, the second sub-grooves 162c can be arranged substantially in parallel with each other. Thus, the first sub-grooves 161c and the second sub-grooves 162c can be intersected with each other so that each of the third isolating grooves 160c can have a lattice-like shape. As a result, the portions of the dummy pattern 130 located between the adjacent conductive patterns 120 can have a plurality of regions having a relatively small area and that are electrically isolated from each other.

According to this fourth example embodiment, the dummy pattern 130 can be divided into the electrically isolated regions by the lattice-like third isolating grooves. Thus, an electrical short between the conductive patterns caused by the conductive particles can be substantially prevented. Further, since the dummy pattern 130 can consume a relatively small area, an increase in a capacitance caused by the dummy pattern 130 can be suppressed or mitigated.

Method of Manufacturing an Interposer Chip

Figure 8:
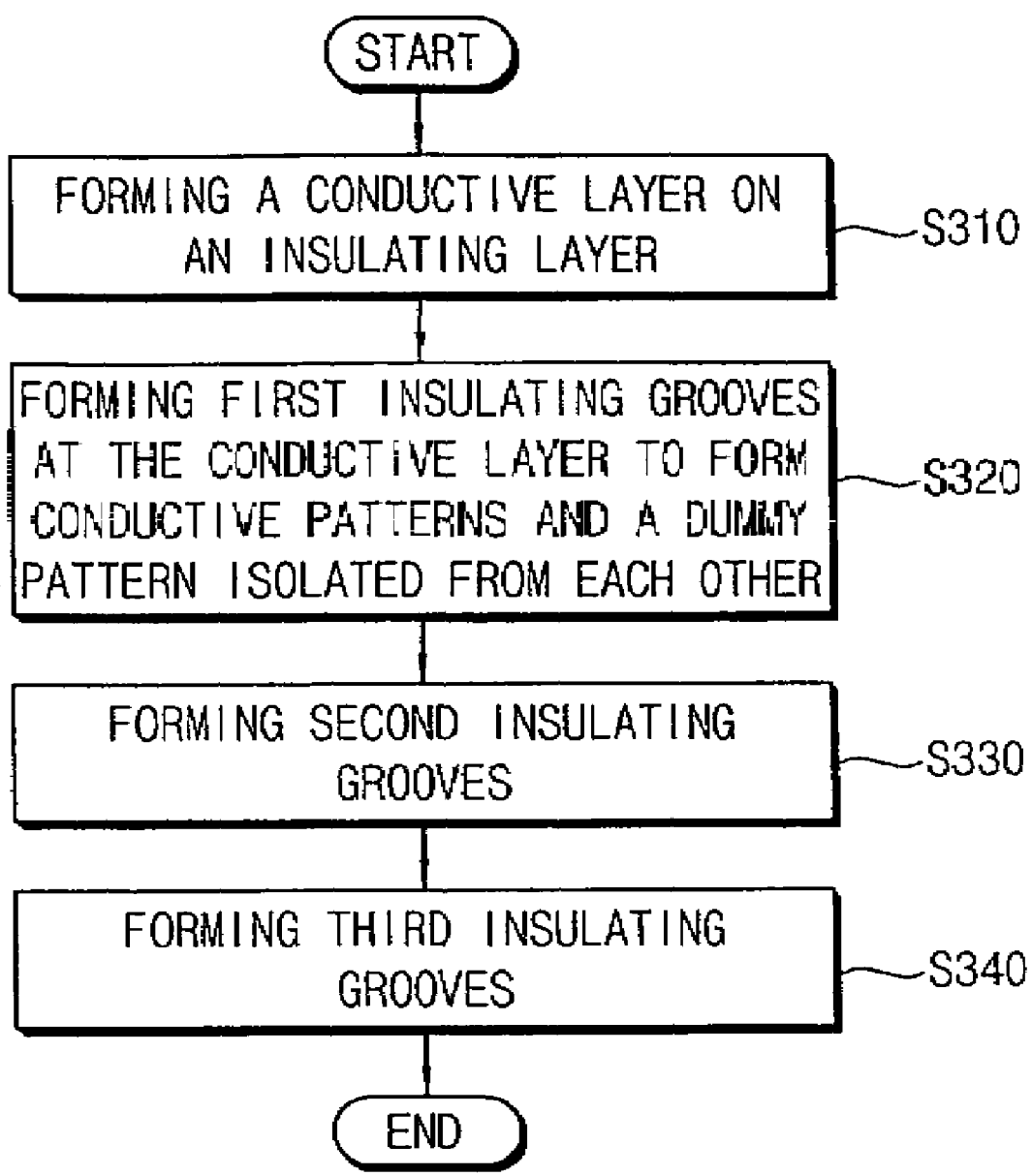
FIG. 8 is a flowchart illustrating an embodiment of a method of manufacturing the interposer chip in FIG. 6 according to aspects of the present invention.

FIG. 8 is a flow chart illustrating an embodiment of a method of manufacturing the interposer chip of FIG. 6.

Referring to FIGS. 6 and 8, in step S310, a conductive layer (not shown) is formed on the insulating layer 110. In this example embodiment, examples of the conductive layer can include aluminum, tungsten, copper, etc. Further, the conductive layer can be formed by a sputtering process, an electroplating process, etc., as would be appreciated by those skilled in the art.

In step S320, the conductive layer is partially etched to form the first isolating grooves 140. Thus, the conductive patterns 120 and the dummy pattern 130 electrically, which are isolated from each other by the first isolating grooves 140, are formed on the insulating layer 110. Here, the first isolating grooves 140 are explained in detail with respect to Example Embodiment 3. Thus, any further discussion with respect to the first isolating grooves 140 is omitted herein for brevity.

In step S330, the conductive layer is then etched to form the second isolating grooves 150. Here, the second isolating grooves 150 are explained in detail with respect to Example Embodiment 3. Thus, any further discussion with respect to the second isolating grooves 150 is omitted herein for brevity. Further, the second isolating grooves 150 can be formed simultaneously with the first isolating grooves 140.

In step S340, the conductive layer is etched to form the third isolating grooves 150 to complete the interposer chip 100b of FIG. 6. Here, the third isolating grooves 160 are explained in detail with respect to Example Embodiment 3. Thus, any further illustrations with respect to the third isolating grooves 160 are omitted herein for brevity. Further, the third isolating grooves 160 can be formed simultaneously with the first isolating grooves 140. That is, the first isolating grooves 140, the second isolating grooves 150, and the third isolating grooves 160 can be formed simultaneously by the single etching process.

Here, in this example embodiment, the method of manufacturing the interposer chip in accordance with the Example Embodiment 3 is exemplarily explained. Further, methods of manufacturing the interposer chips of Example Embodiments 1, 2 and 4 can be substantially the same as the method of manufacturing the interposer chip of Example Embodiment 3, except for the structures of the isolating grooves.

Multi-Chip Package

Figure 9:
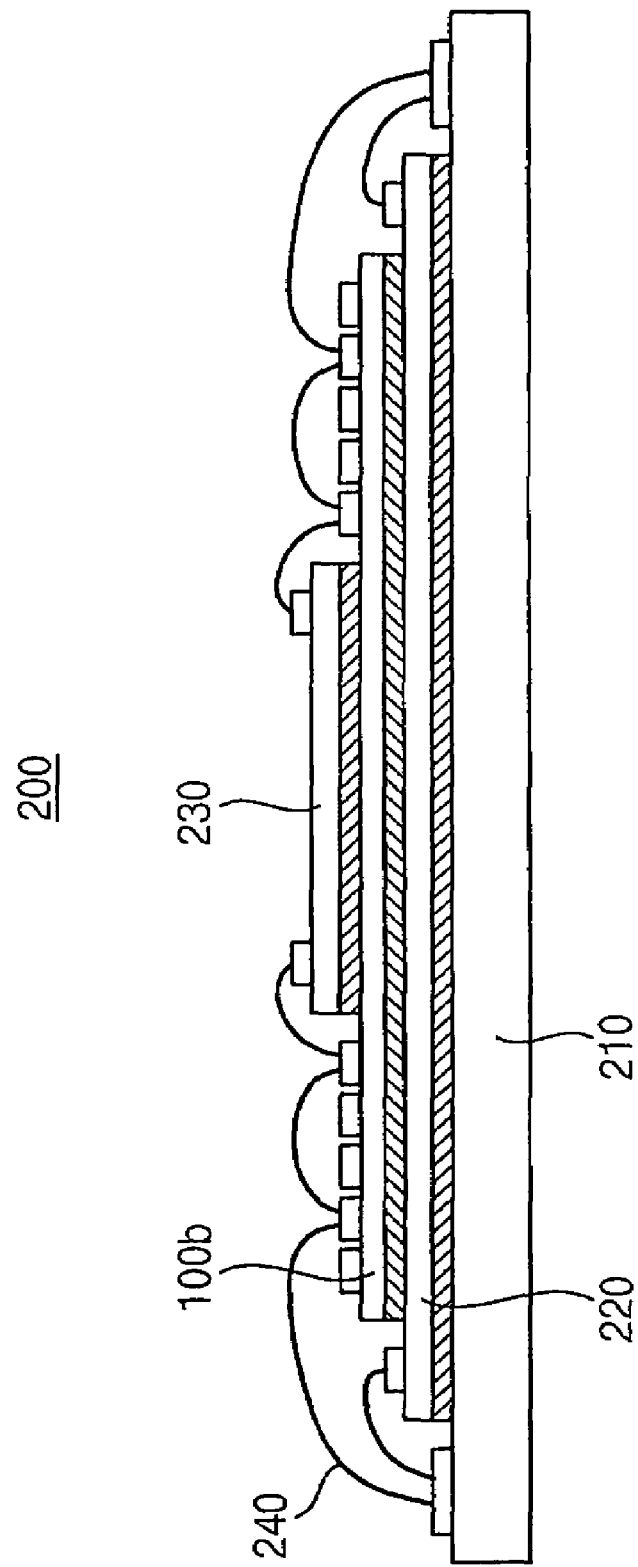
FIG. 9 is a cross-sectional view illustrating an embodiment of a multi-chip package having the interposer chip in FIG. 6 according to aspects of the invention.

FIG. 9 is a cross-sectional view illustrating an embodiment of a multi-chip package having the interposer chip in FIG. 6.

Referring to FIG. 9, a multi-chip package 200 of this example embodiment includes a printed circuit board (PCB) 210, a first semiconductor chip 220, the interposer chip 100b, and a second semiconductor chip 230. Here, the interposer chip 100b is explained in detail with respect to Example Embodiment 3. Thus, any further discussion with respect to the interposer chip 100b is omitted herein for brevity.

The PCB 210 can have a circuit pattern (not shown). Further, the PCB 210 can have pads (not shown) electrically coupled to the circuit pattern. The pads can be arranged on an upper surface of the PCB 210.

The first semiconductor chip 220 is attached to the upper surface of the PCB 210. The first semiconductor chip 220 has pads (not shown) electrically connected to the pads of the PCB 210. In this example embodiment, the pads of the first semiconductor chips 220 can be electrically connected to the pads of the PCB 210 via conductive wires 240. Further, the first semiconductor chip 220 can have a size smaller than that of the PCB 210.

The interposer chip 100b is attached to an upper surface of the first semiconductor chip 220. The pads 121 of the interposer chip 100b can be electrically connected to the pads of the first semiconductor chip 220 via the conductive wires 240. The interposer chip 100b can have a size smaller than that of the first semiconductor chip 220.

The second semiconductor chip 230 is attached to an upper surface of the interposer chip 100b. Pads (not shown) of the second semiconductor chip 230 100b can be electrically connected to the pads 121 of the interposer chip 100b via the conductive wires 240. The second semiconductor chip 230 can have a size smaller than that of the interposer chip 100b. That is, the size of the second semiconductor chip 230 can be smaller than that of the first semiconductor chip 220.

Here, in this example embodiment, the multi-chip package 200 can include the interposer chip 100b in accordance with Example Embodiment 3. Further, the multi-chip package 200 can include any one of the interposer chips of Example Embodiments 1, 2 and 4.

According to this example embodiment, the interposer chip between the first semiconductor chip and the second semiconductor chip can include the dummy pattern, so that the interposer chip can have reinforced strength. As a result, the interposer chip is not nearly as vulnerable to being bent.

According to some example embodiments of the present invention, the interposer chip can have the dummy pattern, so that the interposer chip can have greatly reinforced strength. As a result, the interposer chip is not nearly as vulnerable to being bent.

Further, the dummy pattern can be divided into the electrically isolated regions by the isolating grooves. Thus, the electrical short between the conductive patterns caused by the conductive particles can be avoided.

The foregoing is illustrative of the present invention and is not to be construed as limiting thereof. Although a few example embodiments in accordance with the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents, but also equivalent structures. Therefore, it is to be understood that the foregoing is illustrative of the present invention, which is not to be construed as limited to the specific example embodiments disclosed herein, and that modifications to the disclosed example embodiments, as well as other example embodiments, are intended to be included within the scope of the appended claims. The present invention is defined by the following claims, with equivalents of the claims to be included therein.

What is claimed is:

1. An interposer chip comprising:
   an insulating layer;
   conductive patterns formed on the insulating layer; and
   a dummy pattern formed on the insulating layer and configured to suppress a bending of the insulating layer, the dummy pattern being electrically isolated from the conductive patterns by first isolating grooves that are formed along a periphery of each of the conductive patterns.

2. The interposer chip of claim 1, wherein the dummy pattern further comprises a plurality of second isolating grooves extending from the first isolating grooves to divide a portion of the dummy pattern into a plurality of regions electrically isolated from each other.

3. The interposer chip of claim 2, wherein the plurality of regions includes at least one first region formed in a lengthwise direction of the conductive patterns and each of the second isolating grooves extends from portions of each of the first isolating grooves adjacent to both corners of both ends of each of the conductive patterns to form second regions that are electrically isolated from the at least one first region.

4. The interposer chip of claim 3, wherein the second isolating grooves extend in a direction substantially in parallel with a lengthwise direction of the conductive patterns.

5. The interposer chip of claim 1, wherein the dummy pattern further comprises a plurality of third isolating grooves configured to divide a portion of the dummy pattern between adjacent ones of the conductive patterns into a plurality of regions electrically isolated from each other.

6. The interposer chip of claim 5, wherein each of the third isolating grooves comprises:
   at least one first sub-groove extending in a direction substantially perpendicular to a lengthwise direction of the conductive patterns; and
   at least one second sub-groove extending in a direction substantially in parallel with the lengthwise direction of the conductive patterns.

7. The interposer chip of claim 6, wherein between adjacent conductive patterns there are two first sub-grooves and one of the at least one second sub-groove connected between the two first sub-grooves and configured to form an "I" shape of the third isolating groove.

8. The interposer chip of claim 6, wherein between adjacent conductive patterns there are a plurality first sub-grooves and a plurality of second sub-grooves configured to form a lattice-like shape of the third isolating groove.

9. The interposer chip of claim 1, wherein the conductive patterns and the dummy pattern comprise substantially the same material.

10. The interposer chip of claim 1, wherein each of the conductive patterns comprises:
    two pads; and
    a conductive line connected between the pads, the conductive line having a width narrower than that of the pads.

11. A method of manufacturing an interposer chip, the method comprising:
    forming a conductive layer on an insulating layer; and
    forming first isolating grooves at the conductive layer to form conductive patterns and a dummy pattern electrically isolated from the conductive patterns by the first isolating grooves.

12. The method of claim 11, further comprising forming a plurality of second isolating grooves dividing a portion of the dummy pattern into a plurality of regions electrically isolated from each other.

13. The method of claim 12, wherein the second isolating grooves are formed simultaneously with the first isolating grooves.

14. The method of claim 11, further comprising forming a plurality of third isolating grooves dividing a portion of the dummy pattern between the adjacent ones of the conductive patterns into a plurality of regions electrically isolated from each other.

15. The method of claim 14, wherein the third isolating grooves are formed simultaneously with the first isolating grooves.

16. The method of claim 11, wherein the conductive layer comprises aluminum, tungsten, or copper.

17. A multi-chip package comprising:

a printed circuit board (PCB);

a first semiconductor chip stacked on the PCB and being electrically connected to the PCB;

an interposer chip including an insulating layer that is stacked on the first semiconductor chip and has a size smaller than that of the first semiconductor chip, conductive patterns formed on the insulating layer and electrically connected to the first semiconductor chip, and a dummy pattern formed on the insulating layer that is configured to suppress a bending of the insulating layer, the dummy pattern being electrically isolated from the conductive patterns by first isolating grooves that are formed along a periphery of each of the conductive patterns; and a second semiconductor chip stacked on the interposer chip and electrically connected to the conductive patterns, the second semiconductor chip having a size smaller than that of the interposer chip.

18. The multi-chip package of claim 17, wherein the PCB and the first semiconductor chip, the first semiconductor chip and the interposer chip, and the interposer chip and the second semiconductor chip are electrically connected to each other via conductive wires.

19. The multi-chip package of claim 17, wherein the interposer chip further includes a plurality of second isolating grooves extending from the first isolating grooves to divide a portion of the dummy pattern into a plurality of regions electrically isolated from each other.

20. The multi-chip package of claim 17, wherein the interposer chip further includes a plurality of third isolating grooves dividing a portion of the dummy pattern between adjacent ones of the conductive patterns into a plurality of regions electrically isolated from each other.

* * * * *